United States Patent
Kim et al.

(10) Patent No.: US 8,053,832 B2
(45) Date of Patent: Nov. 8, 2011

(54) CAPACITOR-LESS DRAM DEVICE

(75) Inventors: Sung-hwan Kim, Gyeonggi-do (KR); Yong-chul Oh, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

(21) Appl. No.: 12/603,224

(22) Filed: Oct. 21, 2009

(65) Prior Publication Data

US 2010/0117147 A1    May 13, 2010

(30) Foreign Application Priority Data

Nov. 7, 2008 (KR) .......................... 10-2008-0110487

(51) Int. Cl.
*H01L 27/12*    (2006.01)
(52) U.S. Cl. ............... 257/330; 257/347; 257/E27.112; 365/149; 365/189.09
(58) Field of Classification Search .................. 257/330, 257/347, E27.112, E29.257; 365/149, 189.09
See application file for complete search history.

(56) References Cited

U.S. PATENT DOCUMENTS

| | | | | |
|---|---|---|---|---|
| 7,031,203 | B2 * | 4/2006 | Tang et al. | 365/189.09 |
| 7,034,336 | B2 * | 4/2006 | Willer | 257/60 |
| 7,211,867 | B2 * | 5/2007 | Hayashi et al. | 257/351 |
| 2005/0020086 | A1 * | 1/2005 | Kim et al. | 438/700 |
| 2006/0220085 | A1 * | 10/2006 | Huo et al. | 257/296 |

* cited by examiner

*Primary Examiner* — Thinh T Nguyen
(74) *Attorney, Agent, or Firm* — Myers Bigel Sibley & Sajovec, P.A.

(57) ABSTRACT

Provided is a capacitor-less DRAM device including: an insulating layer formed on a semiconductor substrate; a silicon layer formed on the insulating layer, wherein a trench is formed inside the silicon layer; and an offset spacer formed on both sidewalls of the trench and protruded upward through the silicon layer. A gate insulating layer is formed on a bottom of the trench, and a gate electrode is formed to be buried in the gate insulating layer and in the trench and the offset spacer. A source region and a drain region are formed in the silicon layer on both sides of the offset spacer so as not to overlap with the gate electrode. A channel region is formed in the silicon layer below the gate insulating layer to be self-aligned with the gate electrode.

6 Claims, 12 Drawing Sheets

CAPACITOR-LESS DRAM DEVICE

REFERENCE TO RELATED APPLICATION

This application claims the benefit of Korean Patent Application No. 10-2008-0110487, filed Nov. 7, 2008, the entire contents of which is hereby incorporated herein by reference.

BACKGROUND

The inventive concept relates to dynamic random access memory (DRAM) devices and, more particularly, to capacitor-less DRAM (dynamic random access memory) devices.

In general, a unit memory cell of a DRAM device includes a field effect transistor (hereinafter referred to as a 'transistor') and a capacitor that stores charges. The transistor may be a metal-oxide-semiconductor (MOS) transistor that controls reproduction and recording of data. The integration degree of the DRAM device has been continuously increased by reducing the size of the transistor. Also, the integration degree of the DRAM device has been continuously increased by using a capacitor formation process for providing an effective capacity of a capacitor such as techniques of forming a stack capacitor or a deep trench capacitor, techniques of using a capacitor dielectric layer as a high-k dielectric layer, techniques of increasing a surface area of a dielectric layer in a lower portion of a capacitor, and so forth.

However, a short channel effect due to size reduction of the transistor and the complexity of the capacitor formation techniques hinder the further increase of the integration degree of DRAM devices. Accordingly, attempts have been made to modify the structure of the DRAM devices.

SUMMARY

The inventive concept provides a capacitor-less DRAM device that can be manufactured using a simple capacitor formation process.

The inventive concept also provides a capacitor-less DRAM device that may be fabricated in a highly integration degree and high reliability and prevents the occurrence of leakage current.

According to an aspect of the inventive concept, there is provided a capacitor-less DRAM device comprising: an insulating layer formed on a semiconductor substrate; a silicon layer formed on the insulating layer, wherein a trench is formed in the silicon layer; an offset spacer formed on both sidewalls of the trench and protruding upward through the silicon layer.

A gate insulating layer is formed on a bottom of the trench, and a gate electrode is formed on the gate insulating layer and buried in the trench and the offset spacer. A source region and a drain region are formed in the silicon layer on both sides of the offset spacer so as not to overlap with the gate electrode. A channel region is formed to be self-aligned with the gate electrode in the silicon layer below the gate insulating layer. A partial channel impurity region may be further formed in a silicon layer below the gate insulating layer.

According to another aspect of the inventive concept, there is provided a capacitor-less DRAM device comprising: an insulating layer formed on a semiconductor substrate; a silicon layer formed on the insulating layer, wherein a trench is formed in the silicon layer; and an offset spacer formed on both sidewalls of the trench and protruding upward through the silicon layer.

A gate insulating layer is formed on a bottom of the trench to be aligned with the offset spacer, and a gate electrode is formed on the gate insulating layer and buried in the trench and the offset spacer. A gate spacer is formed on the silicon layer on both sides of the protruded offset spacer. A source region and a drain region are formed on both sides of the offset spacer and in the silicon layer below the gate spacer.

A body region formed between the source region and the drain region. A channel region is formed in the silicon layer of the body region below the gate insulating layer. The body region is electrically floated via a junction region between the body region and the source region and the drain region, and via the insulating layer.

According to another aspect of the inventive concept, there is provided a capacitor-less DRAM device comprising: an insulating layer formed on a semiconductor device; a silicon layer formed on the insulating layer, wherein a trench is formed inside the silicon layer; and an offset spacer formed on both sidewalls of the trench and protruding upward through the silicon layer.

A gate insulating layer is formed on a bottom of the trench to be aligned with the offset spacer. A gate electrode is formed on the gate insulating layer and buried in the trench and the offset spacer. A gate spacer is formed on the silicon layer on both sides of the protruded offset spacer. A source region and a drain region are separated from the gate spacer, which is formed on the both sidewalls of the gate electrode, and are formed in the silicon layer. A channel region is formed in the silicon layer below the gate insulating layer.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
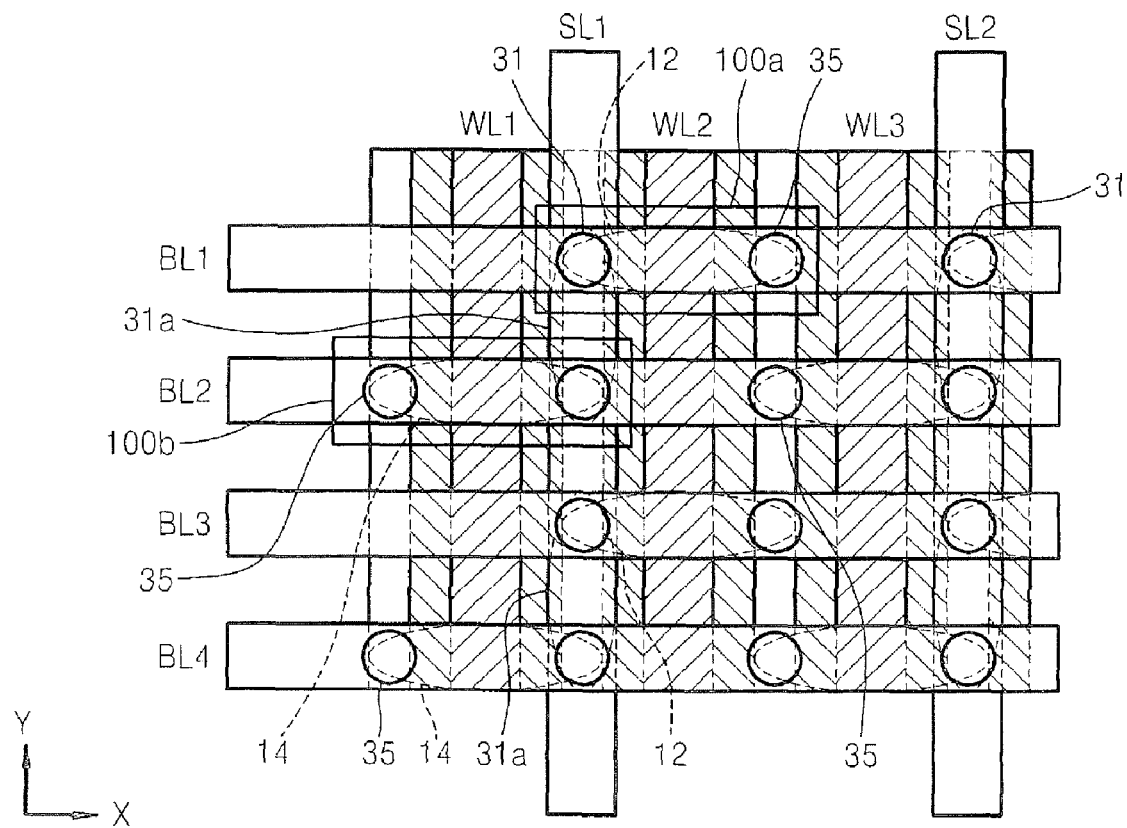
FIG. 1 is a layout of a memory cell of a dynamic random access memory (DRAM) device according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to those skilled in the art. In the drawings, like reference numerals denote like elements.

The inventive concept provides a memory cell of a dynamic random access memory (DRAM) device, the memory cell including one metal-oxide-semiconductor (MOS) transistor and no capacitor. A memory cell of the capacitor-less DRAM device according to the inventive concept, hereinafter referred to as a DRAM device, includes a source region and a drain region, and positions of the source and drain regions may be interchanged. Also, embodiments of the inventive concept may be realized individually or in combination. Thus, combinations of the embodiments are also included in the scope of the inventive concept.

Memory Cell of DRAM Device: Example 1

Figure 2:
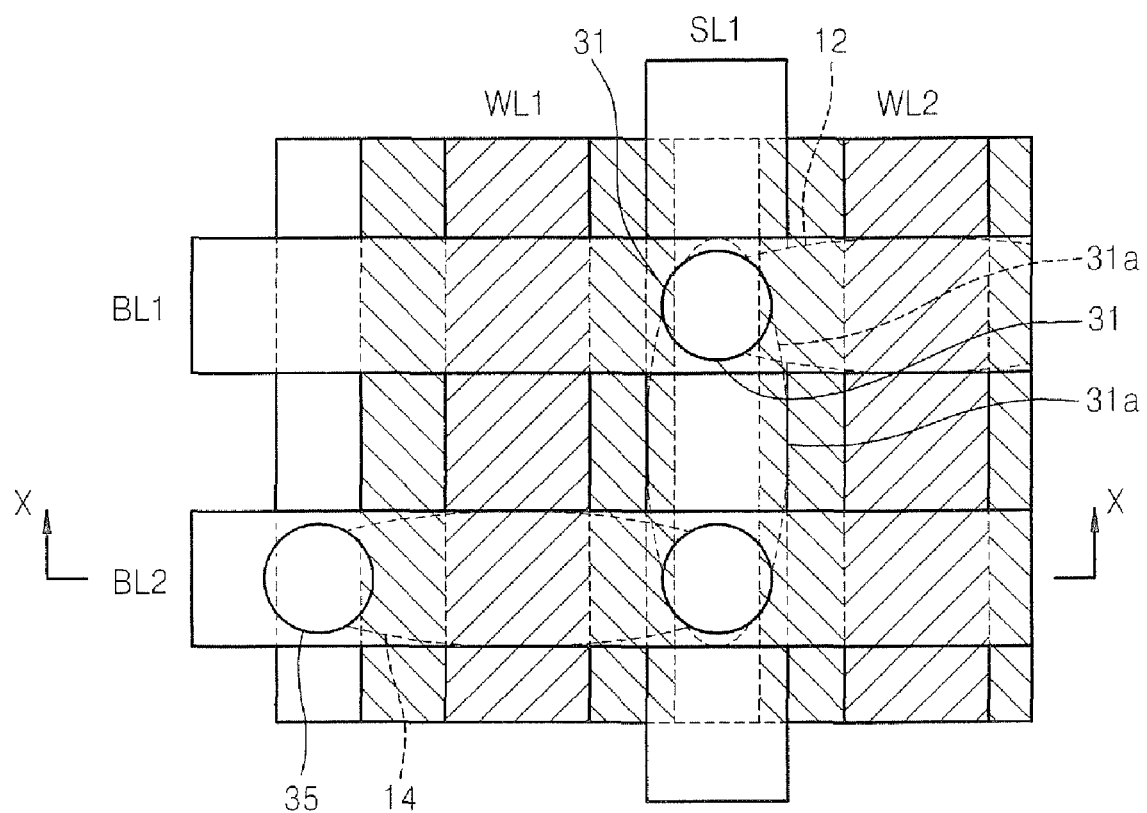
FIG. 2 is an extended view of a portion of the memory cell illustrated in FIG. 1.

FIG. 1 is a layout of a memory cell of a DRAM device according to an embodiment of the inventive concept, and FIG. 2 is an extended view of a portion of the memory cell illustrated in FIG. 1.

In detail, as illustrated in FIG. 1, the DRAM device includes a plurality of memory cells. In FIG. 1, two memory cells are denoted with reference numerals 100a and 100b for convenience. In the DRAM device, a plurality of first active regions 12 are formed to be separated apart from each other in a first direction (X direction). The first active regions 12 are formed in a silicon layer 5 formed on an insulating layer 3 of a semiconductor substrate 1, which are to be described later and illustrated in FIG. 3.

A plurality of second active regions 14 are formed apart from the first active regions 12 in the first direction and in a second direction (Y direction) which is perpendicular to the first direction. The second active regions 14 are also formed in the silicon layer 5 on the insulating layer 3 of the semiconductor substrate 1, which are to be described later and illustrated in FIG. 3. The first active regions 12 and the second active regions 14 are formed such that ends thereof correspond to each other along the second direction. The first active regions 12 and the second active regions 14 are arranged repeatedly in the first and second directions. A plurality of memory cells, for example, the memory cells 100a and 100b, are implemented in the first active regions 12 and the second active regions 14.

A plurality of word lines WL1-WL3 are arranged in the second direction across the first active regions 12 and the second active regions 14, and are separated apart from one another in the first direction. The word lines WL1-WL3 function as a gate electrode 21 illustrated in FIG. 3.

A plurality of source lines SL1-SL2 are arranged between the word lines WL1-WL3 to be parallel to the word lines WL1-WL3 and are connected to portions of the first active regions 12 and the second active regions 14 between the word lines WL1-WL3. The source lines SL1-SL2 are connected to the first active regions 12 and the second active regions 14 via a plurality of source line contacts 31. The source line contacts 31 may be formed in each of the memory cells 100a and 100b. The source line contacts 31a connecting the memory cells 100a and 100b in FIG. 1 may be formed. The source lines SL1-SL2 are connected to source regions (27 in FIG. 3) formed in the active regions 12 and the second active regions 14.

A plurality of bit lines BL1-BL4 are arranged in the first direction along the first active regions 12 and the second active regions 14 and connected to the first active regions 12 and the second active regions 14 via bit line contacts 35. The bit lines BL1-BL4 are connected to drain regions (not shown) formed in the first active regions 12 and the second active regions 14.

As described above, each of the memory cells 100a and 100b of the DRAM device according to the inventive concept includes one unit transistor in each of the first active regions 12 and the second active regions 14. For example, the memory cell 100a of the DRAM device according to the inventive concept includes a word line WL2 in one of the first active regions 12, a bit line BL1 that is connected to a portion of the first active region 12 at a side of the word line WL2, and a source line SL1 that is connected to a portion of the first active region 12 at the other side of the word line WL2.

Figure 3:
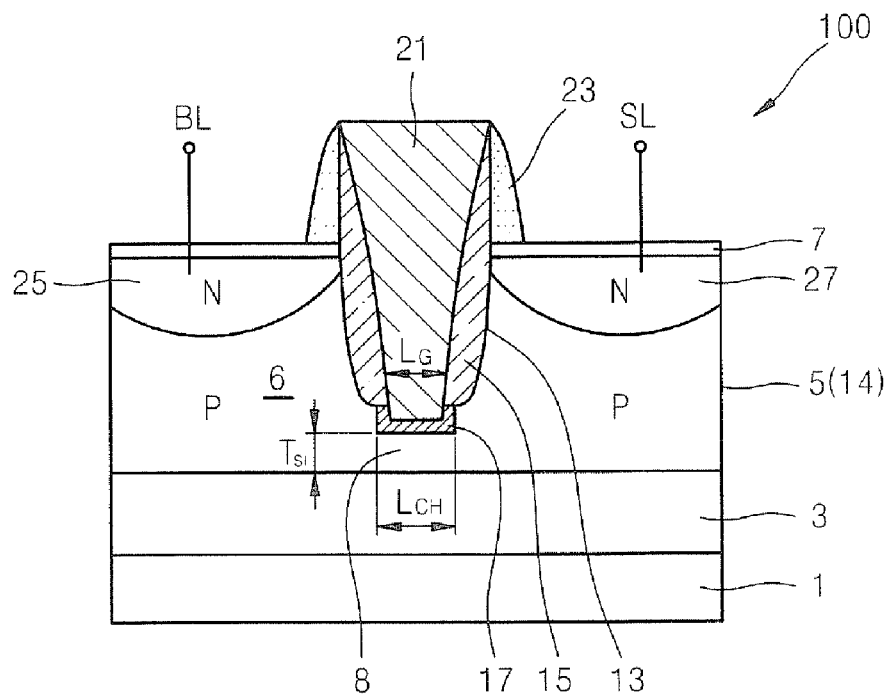
FIG. 3 is a cross-sectional view of the memory cell illustrated in FIG. 2 cut along a line X-X, illustrating the structure of a unit memory cell.

FIG. 3 is a cross-sectional view of the memory cell illustrated in FIG. 2 cut along a line X-X, illustrating the structure of a unit memory cell 100.

In detail, the unit memory cell 100, that is, a unit transistor, of the DRAM device according to the inventive concept includes an insulating layer 3, for example, a silicon oxide layer formed on a semiconductor substrate 1, for example, a p-type silicon wafer (p-type silicon substrate), and an n-type source region 25, an n-type drain region 27, and a p-type body region 6 that are formed on a silicon layer 5 on the insulating layer 3.

The silicon layer 5, the insulating layer 3, and the semiconductor substrate 1 may be a silicon-on-insulator (SOI) substrate. The insulating layer 3 may be a buried oxide (BOX) layer that is formed using a separation by implanted oxygen (SIMOX) method or a bonding and layer transfer method. The insulating layer 3 may be formed of a silicon oxide layer formed using a chemical vapor deposition method.

The silicon layer 5 may be a p-type silicon layer. The silicon layer 5 becomes a second active region 14 in which the memory cell 100 is formed. The active region is insulated using a device isolation layer (not shown) that surrounds the active region. One unit transistor is formed on one active region.

The body region 6 is disposed between the source region 25 and the drain region 27. The body region 6 is electrically floated by junction region between the body region and the source and drain region 25 and 27, and by the insulating layer 3. The body region 6, the source region 25, and the drain region 27 may be formed in an active region like a conventional transistor.

The DRAM device according to the inventive concept includes an offset spacer 15 formed in a trench 13, a gate electrode 21, the source region 25, the drain region 27, and the body region 6 formed between the source region 25 and the drain region 27. A pad insulating layer 7 and a gate spacer 23 may be formed or not formed in the unit transistor of FIG. 3.

The trench 13 is formed in the silicon layer 5. The offset spacer 15 is formed on both sidewalls of the trench 13 and protrudes upward through the silicon layer 5. The offset spacer 15 may be formed of a silicon oxide layer. A gate insulating layer 17 may be formed on a bottom of the trench 13. The gate insulating layer 17 may be formed of a high-k dielectric layer having higher permittivity that a silicon oxide layer or a silicon oxide layer. The gate electrode 21 is formed above the gate insulating layer 17 to be buried in the trench 13 and the offset spacer 15. The gate electrode 21 is formed using a metal gate electrode having low resistance.

The source region 25 and the drain region 27 are formed on both sides of the offset spacer 15 in the silicon layer 5, and do not overlap with the gate electrode 21. The gate spacer 23 is formed on the silicon layer 5 or on the pad insulating layer 7 on both sides of the offset spacer 15. The gate spacer 23 is formed of a silicon oxide layer.

A word line WL is connected to the gate electrode 21, and a bit line BL and a source line SL are connected to the source region 25 and the drain region 27. In FIG. 3, $L_{CH}$ is a channel length, and $T_{si}$ is a thickness of the silicon layer 5 below the gate insulating layer 17. Also, $L_G$ is a lower width of the gate electrode 21 in the upper portions of a channel region 8 and the gate insulating layer 17.

In the DRAM device according to the inventive concept, the thickness $T_{si}$ of the silicon layer 5 below the gate insulating layer 17 may preferably be smaller than a third of the lower width $L_G$ of the gate electrode 21 so that the channel region 8 can be easily formed during the operation of the DRAM device. The lower width $L_G$ of the gate electrode 21 may be 20 nm to 25 nm. The offset spacer 15 may preferably be formed of a silicon oxide layer so that an inversion layer is not formed during the operation of the DRAM device on a sidewall of the trench 13 adjacent to the offset spacer 15. The thickness of the offset spacer 15 may preferably be about 40 to 60 Å.

Hereinafter, the operation of the DRAM device according to the inventive concept will be described in detail.

When a predetermined control signal and a predetermined bias signal are applied to the gate electrode 21, the source region 25, and the drain region 27, collision ionization may be generated near the junction region between the body region 6 and the source region 25 and the drain region 27, or a gate induced drain leakage (GIDL) may be caused by band to band tunneling. Due to the collision ionization or the GIDL, an excessive amount of charges is generated in the body region 6 that is floated, and the charges are stored in the floated body region 6 and displayed as logic data 1, or emitted to the drain region 27 and the source region 25 and displayed as logic data 0.

For example, when the body region 6 is of a p-type, and the source region 25 and the drain region 27 are of an n-type, collision ionization due to hot electrons may be generated near the junction region between the body region 6 and the source region 25 and/or the drain region 27. Electron-hole pairs are generated due to the collision isolation, and the generated holes are accumulated in the body region 6 and displayed as logic data 1. Also, when a forward direction bias voltage is applied to the junction region between the body region 6 and the source region 25 or the drain region 27, excessive holes are accumulated in the body region 6 and emitted to the source region 25 and the drain region 27, thereby logic data 0 being displayed.

In the unit memory cell 100 of the DRAM device according to the inventive concept, the recoding status can be detected by detecting a change in a current of the drain region 27 according to the density of the excessive holes accumulated in the body region 6. Also, as the body region 6 which can store charges is formed in the unit memory cell 100 of the DRAM device according to the inventive concept, a complicated formation process of a capacitor can be omitted. Accordingly, according to the inventive concept, the integration degree of the DRAM device can be further increased, and thus the DRAM device can be manufactured economically.

Also, since the DRAM device according to the inventive concept includes the gate insulating layer 17 and the gate electrode 21 in the trench 31, the source region 25, the drain region 27, and the channel region 8 are not disposed on the same plane, which is advantageous in terms of realizing a high integration degree. Also, in the DRAM device according to the inventive concept, the source region 25 and the drain region 27 are formed in the silicon layer 5 on both sides of the offset spacer 15 and do not overlap with the gate electrode 21. Thus, a leakage current due to a short channel effect or a leakage current in an off state such as GIDL leakage current which are generated when increasing the integration degree of the DRAM device can be reduced.

Also, the DRAM device according to the inventive concept includes the channel region 8 that is self-aligned with the offset spacer 15 in the silicon layer 5 below the gate insulating layer 17, that is, in the body region 6. Thus the DRAM device can be operated easily through the gate electrode 21.

In other words, when the n-type source region 25, the p-type body region 6, and the n-type drain region 27 operate like an npn bipolar transistor, the channel region 8 is automatically aligned by the offset spacer 15 as a base region, and the width of the channel region 8 is determined according to the width of the offset spacer 15. Accordingly, the DRAM device according to the inventive concept may be easily operated through the gate electrode 21.

Also, the DRAM device according to the inventive concept includes the gate insulating layer 17 and the gate electrode 21 formed in the trench 13, and thus the surface area of the body region 6 between the source region 25 and the drain region 27 is large and the storage surface for holes is also large. Accordingly, the DRAM device can be operated reliably. The structural effects of the above-described DRAM device will be described in detail with reference to the comparative examples below.

Memory Cell of DRAM Device of Comparative Example 1

Figure 4:
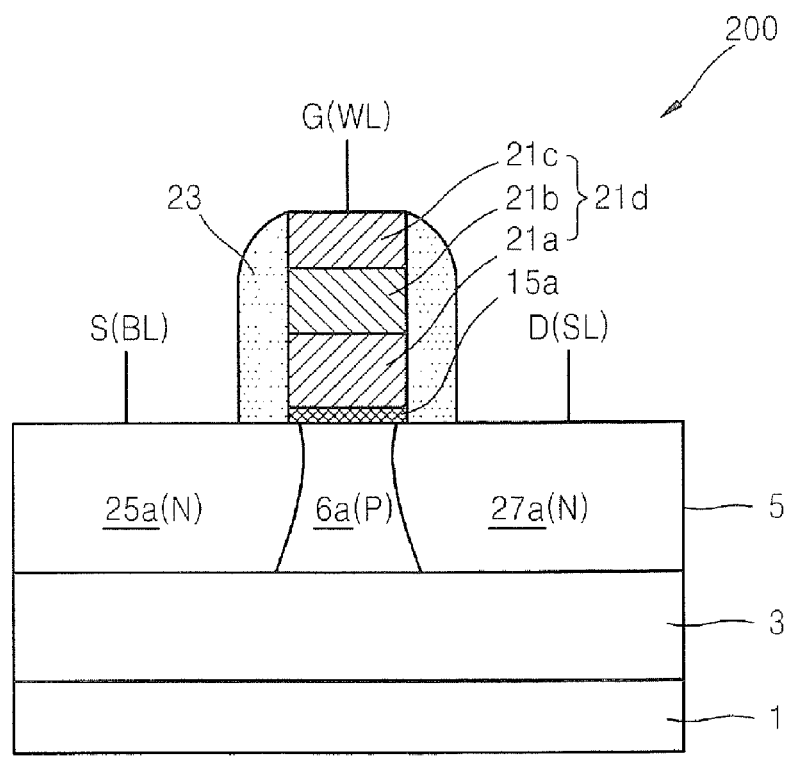
FIG. 4 is a cross-sectional view of a memory cell of a DRAM device according to Comparative Example 1 for comparison with the memory cell of FIG. 3.

FIG. 4 is a cross-sectional view of a memory cell 200 of a DRAM device according to Comparative Example 1 for comparison with the memory cell of FIG. 3. In FIG. 4, the same reference numerals as in FIG. 3 denote like elements.

In detail, the memory cell 200 has a structure in which a source region 25a and a drain region 27a are overlapped with a gate electrode 21d. The memory cell 200 includes an insulating layer 3 formed on a semiconductor substrate 1 and a silicon layer 5 formed on the insulating layer 3. A gate insulating layer 15a and the gate electrode 21d are formed on the silicon layer 5. The gate electrode 21d is formed of a poly-silicon layer 21a doped with impurities, a metal silicide layer 21b, and a capping layer 21c.

A gate spacer 23 is formed on both sidewalls of the gate insulating layer 15a and the gate electrode 21d. The source region 25a and the drain region 27a are formed in the silicon layer 5 so as to overlap with the gate insulating layer 15a and the gate electrode 21d, and a body region 6a is formed between the overlapped source region 25a and the overlapped drain region 27a.

Since the source region 25a and the drain region 27a are overlapped with the gate electrode 21d in the memory cell 200 of the DRAM device according to Comparative Example 1 of FIG. 4, a large leakage current due to a short channel effect or a large leakage current in an off state such as GIDL is generated when the DRAM device is highly integrated, and thus the DRAM device does not operate properly. In addition, the source region 25a, the drain region 27a, and the body region 6a which form a channel region are disposed on the same plane in the memory cell 200, and thus it is difficult to achieve high integration of the DRAM device.

Memory Cell of DRAM Device according to Comparative Example 2

Figure 5:
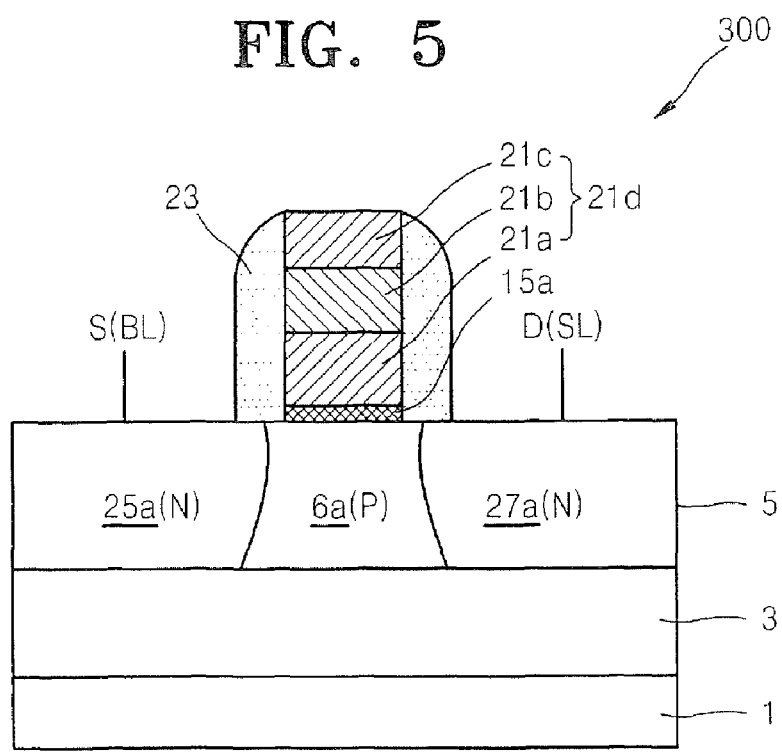
FIG. 5 is a cross-sectional view of a memory cell of a DRAM device according to Comparative Example 2 for comparison with the memory cell of FIG. 3.

FIG. 5 is a cross-sectional view of a memory cell 300 of a DRAM device according to Comparative Example 2 for comparison with the memory cell of FIG. 3. In FIG. 5, the same reference numerals as in FIGS. 3 and 4 denote like elements.

In detail, the memory cell 300 is identical to the memory cell 200 of FIG. 4 except that the source region 25a and the drain region 27a do not overlap with the gate electrode 21d. That is, the source region 25a and the drain region 27a are formed in the silicon layer 5 not to overlap with the gate insulating layer 15a and the gate electrode 21d, and a body region 6a is formed between the source region 25a and the drain region 27a which do not overlap.

Since the source region 25a and the drain region 27a do not overlap with the gate electrode 21d in the memory cell 300, a leakage current due to the short channel effect or a leakage current in an off state such as GIDL can be reduced compared to the memory cell 200 according to Comparative Example 1 of FIG. 4.

However, in the memory cell 300 according to Comparative Example 2 of FIG. 5, the width of a gate spacer 23a needs to be thick so that the source region 25a and the drain region 27a do not overlap with the gate electrode 21d, and thus the operational voltage is increased. In addition, the source region 25a, the drain region 27a, and the body region 6a forming a channel region are disposed on the sample plane, and the width of the gate spacer 23a also needs to be thick, which is disadvantageous for high integration of the DRAM device.

Compared to the memory cells 200 and 300 of the DRAM devices according to Comparative Examples 1 and 2 of FIGS. 4 and 5, the memory cell 100 of the DRAM device according to the inventive concept is advantageous for high integration of the DRAM device since the gate insulating layer 17 and the gate electrode 21 are realized inside the trench 13 and thus the source region 25, the drain region 27, and the channel region 8 are not disposed on the same plane.

Also, the source region 25 and the drain region 27 do not overlap with the gate electrode 21 in the memory cell 100 of the DRAM device according to the inventive concept, and thus a leakage current due to the short channel effect or leakage current in an off state such as GIDL can be reduced.

Also, the channel region 8 is defined in the silicon layer 5 below the gate insulating layer 17, that is, in the body region 6, so as to be self-aligned with the offset spacer 15, and thus the DRAM device can be easily operated through the gate electrode 21.

Also, the gate insulating layer 17 and the gate electrode 21 are formed in the trench 13 in the memory cell 100 of the DRAM device according to the inventive concept, and thus the surface area of the body region 6 between the source region 25 and the drain region 27 is large. Accordingly, the storage surface area for holes is also large, and thus the DRAM device can operate reliably.

Method of Manufacturing the Memory Cell of DRAM device of Example 1

FIGS. 6 through 12 are cross-sectional views illustrating a method of manufacturing the memory cell 100 of the DRAM device of FIG. 3.

Figure 6:
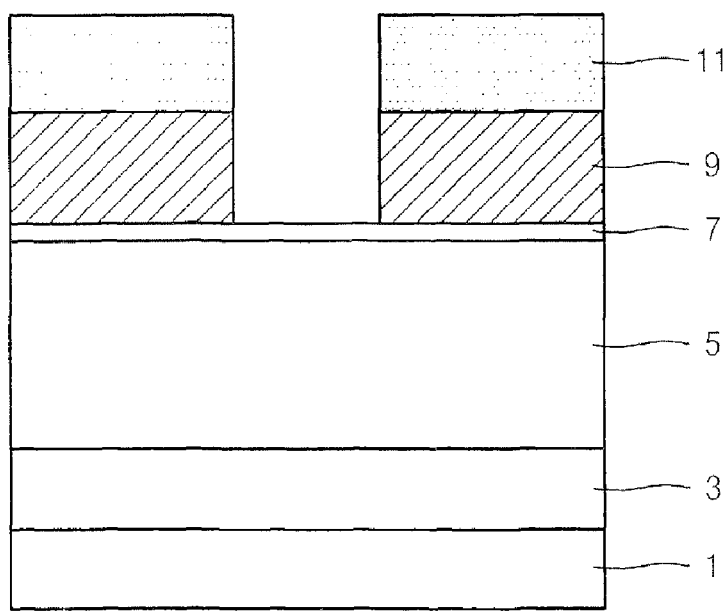
FIGS. 6 through 12 are cross-sectional views illustrating a method of manufacturing the memory cell of the DRAM device of FIG. 3.

Referring to FIG. 6, an insulating layer 3 and a silicon layer 5 are formed on a semiconductor substrate 1. The silicon layer 5, the insulating layer 3, and the semiconductor substrate 1 may be a SOI substrate. The insulating layer 3 may be a BOX layer that is formed using a SIMOX method or a bonding and layer transfer method. The insulating layer 3 may be formed of a silicon oxide layer using a chemical vapor deposition method.

A pad insulating layer 7 such as a silicon oxide layer, and a mask layer 9 are sequentially formed on the silicon layer 5. The mask layer 9 is formed using a silicon nitride layer. A photoresist pattern 11 is formed on the mask layer 9 using a photography process, and then the photoresist pattern 11 is used as a mask to etch the mask layer 9 to pattern the mask layer 9.

Figure 7:
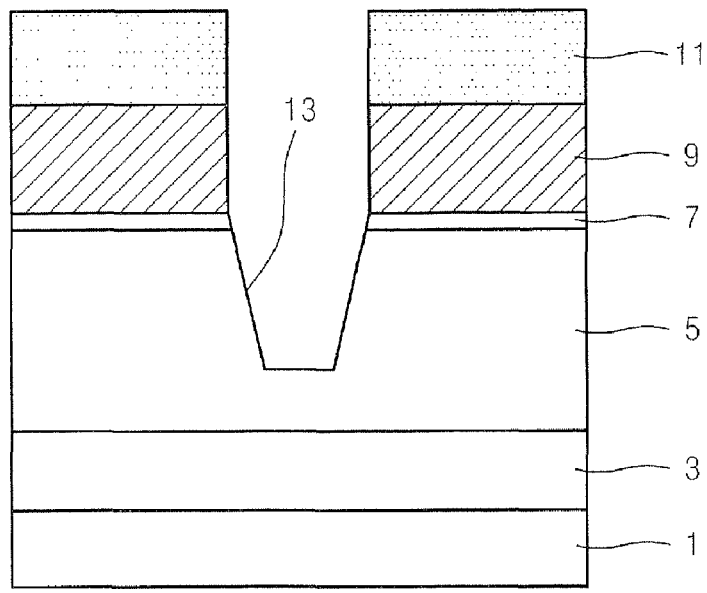

Referring to FIG. 7, the pad insulating layer 7 and the silicon layer 5 are etched using the photoresist pattern 11 and the patterned mask layer 9 as an etching mask, thereby forming a trench 13 in the silicon layer 5. An upper width of the trench 13 is about 40 nm. The depth of the trench 13 is determined according to the device design rules. The trench 13 in FIG. 7 may also be referred to as a recess hole or another term. In any case, a recess hole or a trench is formed by etching the silicon layer 5 according to the inventive concept. Although the trench 13 in FIG. 7 is shown to be inclined, the trench 13 may not be inclined.

Figure 8:
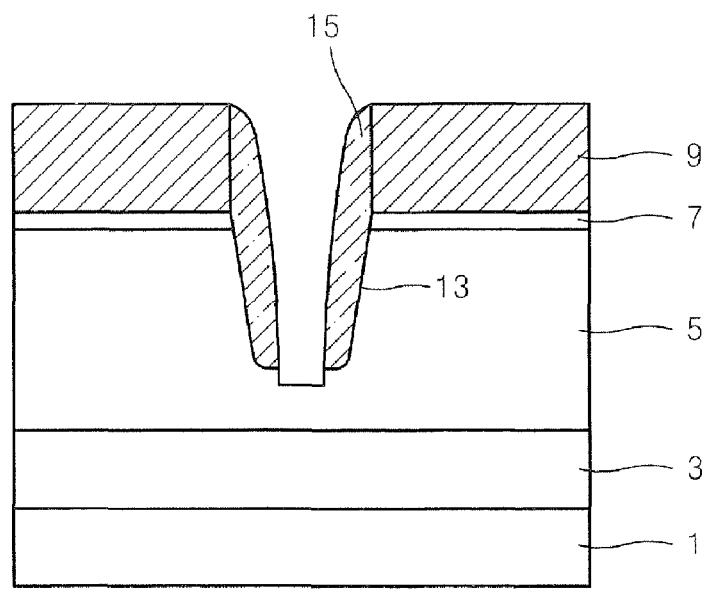

Referring to FIG. 8, the photoresist pattern 11 is removed. An offset spacer 15 is formed on sidewalls of the pad insulating layer 7 and the patterned mask layer 9. The offset spacer 15 may preferably be formed of a silicon oxide layer so that no inversion layer is formed on the sidewalls of the trench 13 even when a negative voltage is applied to a gate electrode 21 during the operation of the DRAM device. The thickness of the offset spacer 15 may preferably be 40 to 60 Å.

The offset spacer 15 is formed by forming an oxide layer over the silicon layer 5 in which the trench 13, the patterned pad insulating layer 7, and the patterned mask layer 9 are formed and then by anisotropically etching the oxide layer. Accordingly, the offset spacer 15 is not formed on a bottom of the trench 13. The offset spacer 15 is formed on both sidewalls of the trench 13 and protrudes upward through the silicon layer 5.

Figure 9:
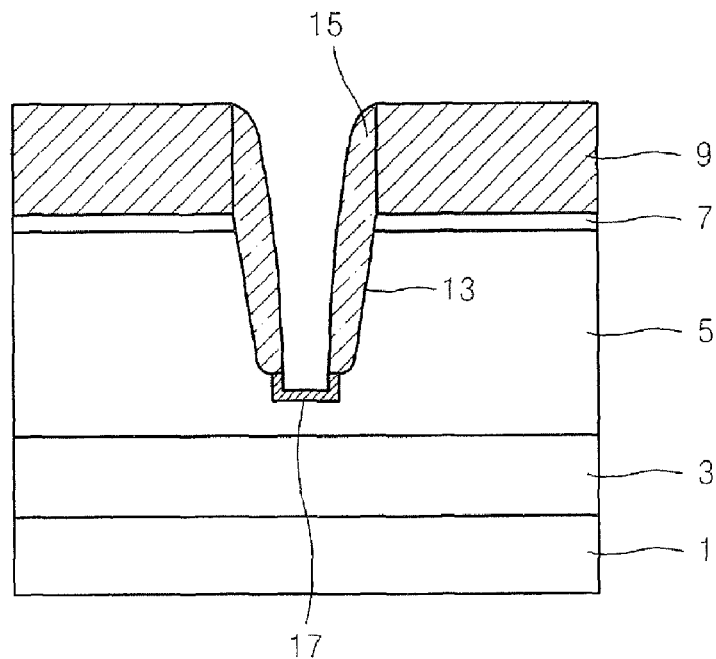

Referring to FIG. 9, a gate insulating layer 17 is formed on the bottom of the trench 13. The gate insulating layer 17 is formed by thermally oxidizing the silicon layer 5 and growing a silicon oxide layer on the bottom of the trench 13. Also, the gate insulating layer 17 may be formed of a high-k dielectric layer having higher permittivity than the silicon oxide layer. The gate insulating layer 17 is determined by the offset spacer 15.

Accordingly, according to the inventive concept, a channel region is formed to be self-aligned with the gate electrode 21 in the silicon layer 5 below the gate insulating layer 17 when the DRAM device is operated. The channel region is defined in the silicon layer 5 below the gate insulating layer 17 to be self-aligned with the offset spacer 15, and thus the DRAM device can be easily operated through the gate electrode 21.

Figure 10:
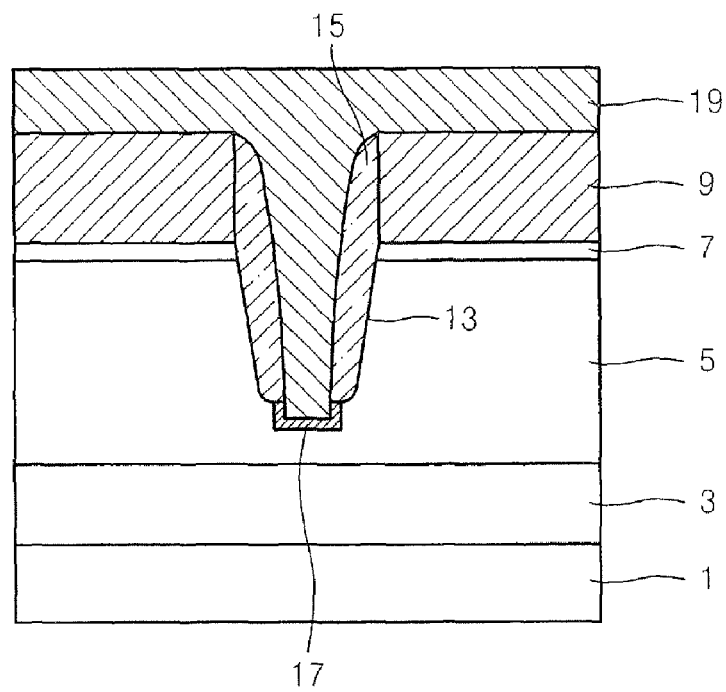
Figure 11:
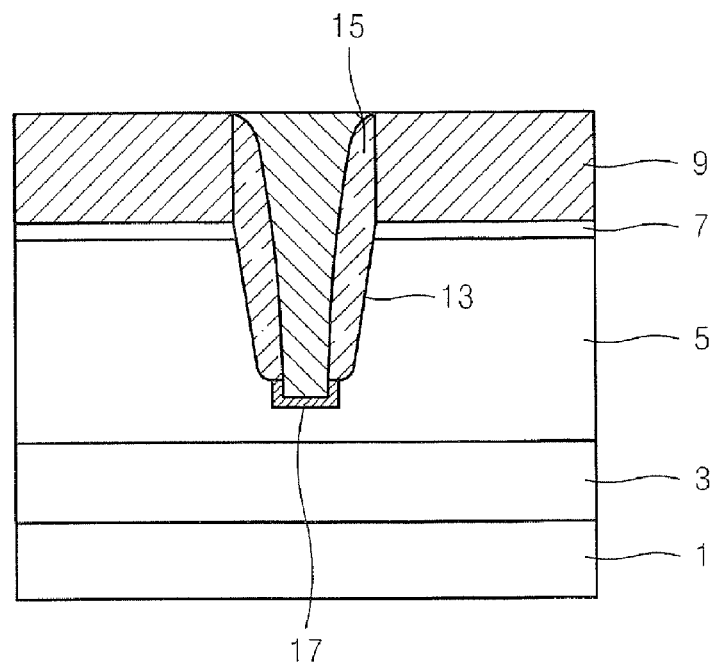

Referring to FIGS. 10 and 11, a metal layer 19 for a gate electrode is buried in the gate insulating layer 17, the trench 13, and the offset spacer 15, and in the patterned mask layer 9. The metal layer 19 is formed of a titanium nitride (TiN) layer. The metal layer 19 for a gate electrode may also be formed of a metal layer other than the TiN layer.

Next, as illustrated in FIG. 11, the metal layer 19 is planarized using a process such as a chemical mechanical polishing (CMP) process to form the gate electrode 21 to be buried in the gate insulating layer 17, the trench 13, and the offset spacer 15. A lower width of the gate electrode 21 is about 20 to about 25 nm. The gate electrode 21 may be formed using a damascene process. Since the gate electrode 21 is formed using a metal layer, a resistance during the operation of the DRAM device can be reduced.

Figure 12:
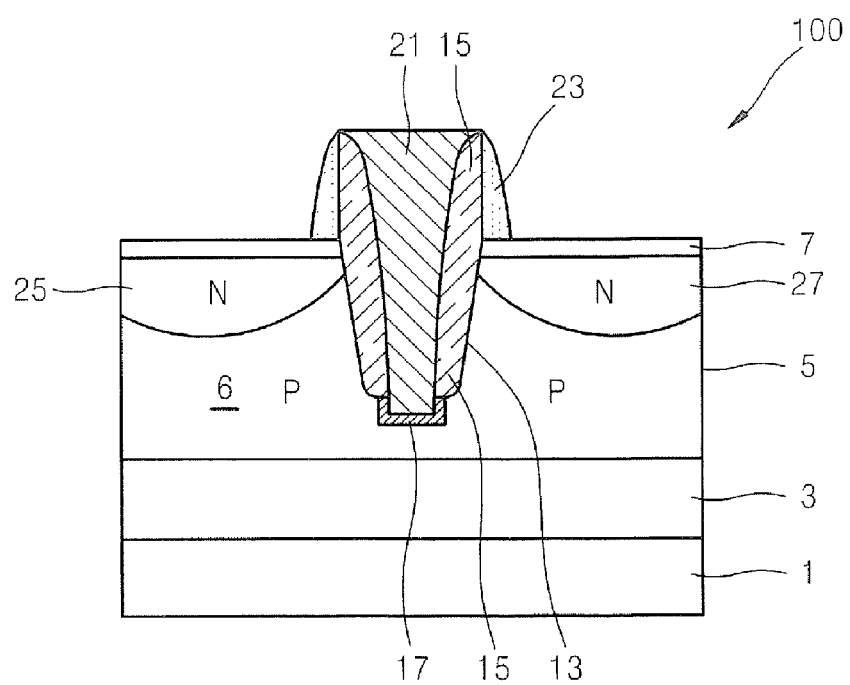

Referring to FIG. 12, the patterned mask layer 9 is removed. A gate spacer 23 is formed on the pad insulating layer 7 on both sidewalls of the offset spacer 15. The source region 25 and the drain region 27 are formed in the silicon layer 5 on both sides of the offset spacer 15 so as not to overlap with the gate electrode 21. When the pad insulating layer 7 is not formed or is removed, the gate spacer 23 is formed on the source region 25 and the drain region 27 on the both sidewalls of the offset spacer 15.

The source region 25 and the drain region 27 are formed by implanting impurities such as n-type impurities, fluorine or phosphorus, in the silicon layer 5 in a dose of 2E13-3E13/cm$^2$. The source region 25 and the drain region 27 may be formed before forming the gate spacer 23. Also, the source region 25 and the drain region 27 may be completed by implanting impurities in the silicon layer 5 after forming the gate spacer 23 by partially implanting impurities in the silicon layer 5 adjacent to the offset spacer 15 before forming the gate spacer 23.

Memory Cell of DRAM Device According to Example 2

Figure 13:
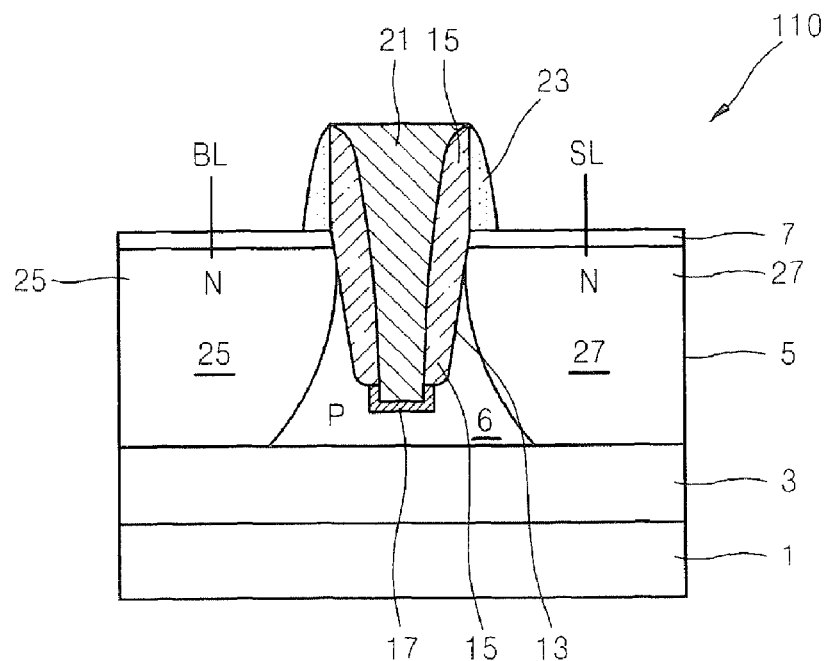
FIG. 13 is a cross-sectional view of a memory cell of a DRAM device according to another embodiment.

FIG. 13 is a cross-sectional view of a memory cell 110 of a DRAM device according to another embodiment.

In detail, the memory cell 110 according to Example 2 is identical to the memory cell 100 of FIG. 3 in terms of the structure and effect except that the source region 25 and the drain region 27 are formed to contact the insulating layer 3.

In other words, in the memory cell 110, the source region 25 and the drain region 27 are formed in the silicon layer 5 on both sides of the offset spacer 15, and the source region 25 and the drain region 27 are formed to contact the insulating layer 3. Then the surface area of the body region 6 is reduced, but the DRAM device can be operated more stably.

Figure 14:
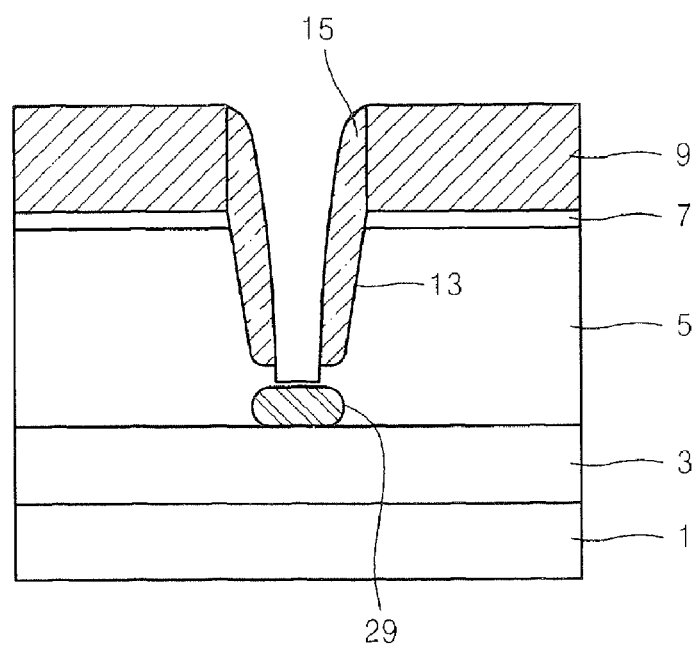
FIGS. 14 and 15 are cross-sectional views for explaining a memory cell of a DRAM device according to another embodiment and a method of manufacturing the memory cell.
Figure 15:
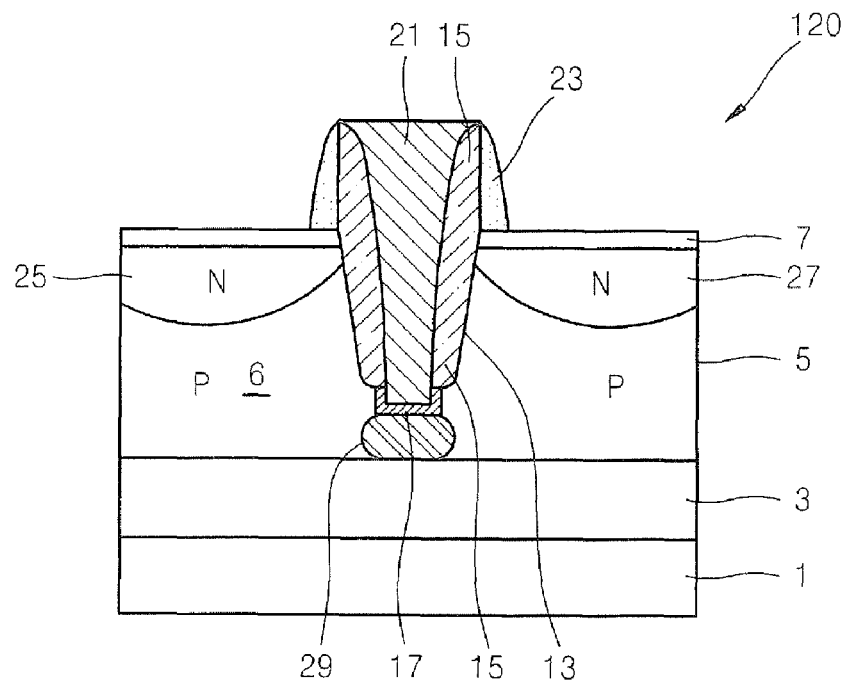

Memory Cell of DRAM Device According to Example 3 and Method of Manufacturing the Same FIGS. 14 and 15 are cross-sectional views for explaining a memory cell 120 of a DRAM device according to another embodiment and a method of manufacturing the memory cell 120.

In detail, the memory cell 120 is identical to the memory cell 100 of FIG. 3 in terms of the structure and effect except that a local channel impurity region 29 is formed in the silicon layer 5 below the gate insulating layer 17.

Referring to FIG. 14, the manufacturing operations of FIGS. 6 through 8 of Example 1 are performed. Then, channel impurities such as boron is implanted in the entire surface of the silicon layer 5 in which the offset spacer 15 is formed, as shown in FIG. 14. Thus, a channel impurity region 29 is formed locally in the silicon layer 5 below the bottom of the trench 13.

Referring to FIG. 15, the manufacturing operations of FIGS. 9 through 12 are performed after forming the local channel impurity region 29, thereby completing the memory cell 120 of the DRAM device. Thus, as the local channel impurity region 29 is formed in the silicon layer 5 below the gate insulating layer 17 on the bottom of the trench in the memory cell 120 of the DRAM device according to Example 3, and thus a leakage current is reduced, and the operational voltage can be reduced accordingly.

Figure 16:
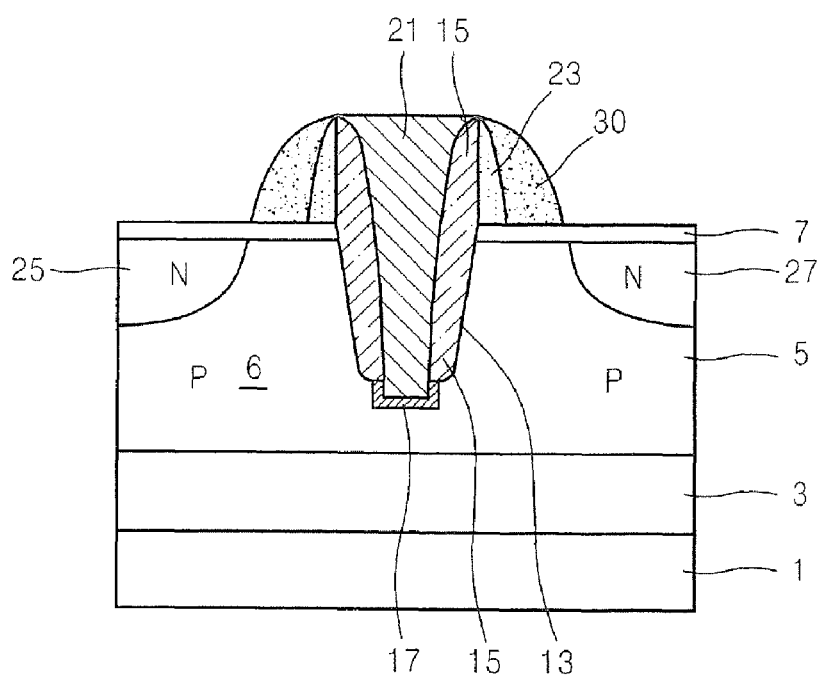
FIGS. 16 and 17 are cross-sectional views for explaining a memory cell of a DRAM device according to another embodiment and a method of manufacturing the memory cell.
Figure 17:
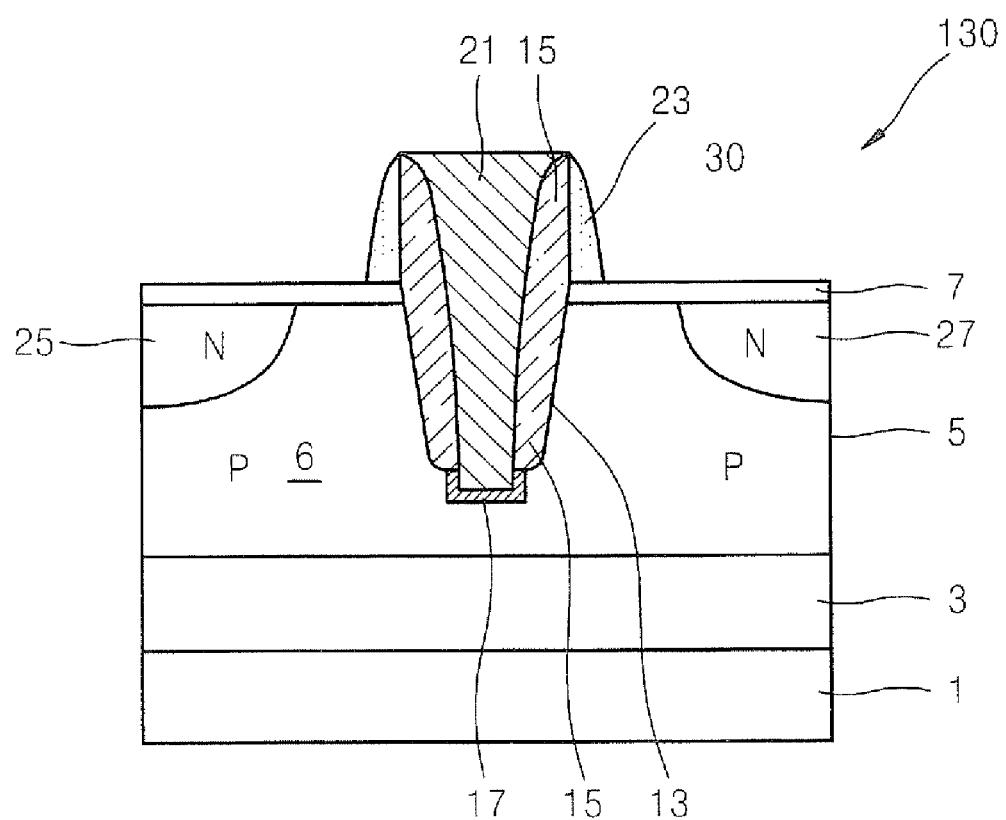

Memory Cell of DRAM Device According to Example 4 and Method of Manufacturing the Same FIGS. 16 and 17 are cross-sectional views for explaining a memory cell 130 of a DRAM device according to another embodiment and a method of manufacturing the memory cell 130.

In detail, the memory cell 130 is identical to the memory cell 100 of FIG. 3 in terms of the structure and effect except that the source region 25 and the drain region 27 are formed in the silicon layer 5 to be separated apart from the gate spacer 23 which is formed on both sidewalls of the gate electrode 21.

Referring to FIG. 16, the manufacturing operations described with reference to FIGS. 6 through 11 of Example 1 are performed. Then, the patterned mask layer 9 is removed to form the gate spacer 23 on the pad insulating layer 7 on both sidewalls of the offset spacer 15. Next, a disposal spacer 30 is formed on the pad insulating layer 7 on sidewalls of the gate spacer 23. The disposal spacer 30 may be formed of a silicon oxide layer.

Next, impurities are implanted into the silicon layer 5 in which the gate electrode 21, the gate spacer 23, and the disposal spacer 30 are formed, in order to form the source region 25 and the drain region 27 in the silicon layer 5 that are separated apart from the gate spacer 23.

Referring to FIG. 17, the disposal spacer 30 is removed to complete the memory cell 130 of the DRAM device. Thus, as described above, the memory cell 130 is formed so that the source region 25 and the drain region 27 in the silicon layer 5 are separated from the gate spacer 23. Thus, the source region 25 and the drain region 27 can be formed definitely not to overlap with the gate electrode 21.

Hereinafter, application examples using the DRAM device according to the inventive concept will be described. When the DRAM device is packaged, a DRAM chip is obtained. Here, a few of various application examples will be described.

Figure 18:
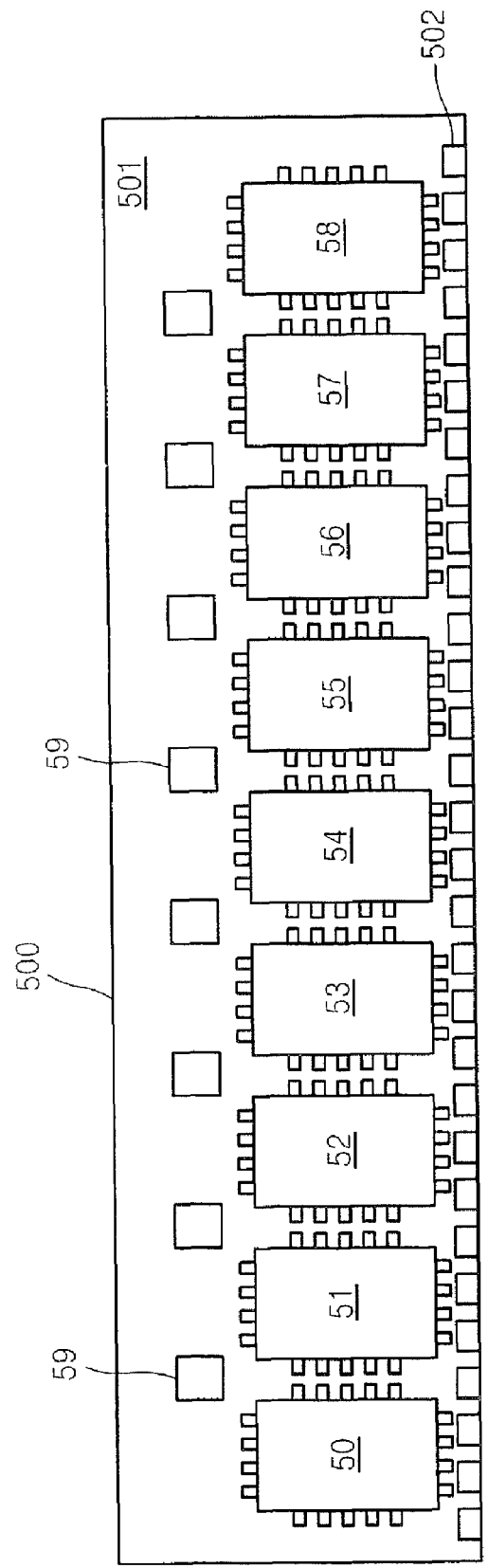
FIG. 18 is a plan view of a memory module including a DRAM chip according to the inventive concept.

FIG. 18 is a plan view of a memory module 500 including DRAM chips according to the inventive concept.

In detail, DRAM chips 50-58 are formed by individually packaging integrated circuit semiconductor devices according to the inventive concept. The DRAM chips 50-58 may be used in the memory module 500. The memory module 500 includes the DRAM chips 50-58 attached on a module substrate 501. In the memory module 500, a plurality of connection portions 502 which can be inserted into sockets of a mother board are formed on portions of the module substrate 501, and a plurality of ceramic decoupling capacitors 59 are formed on the module substrate 501. The memory module 500 may also be manufactured in other various forms than as illustrated in FIG. 18.

Figure 19:
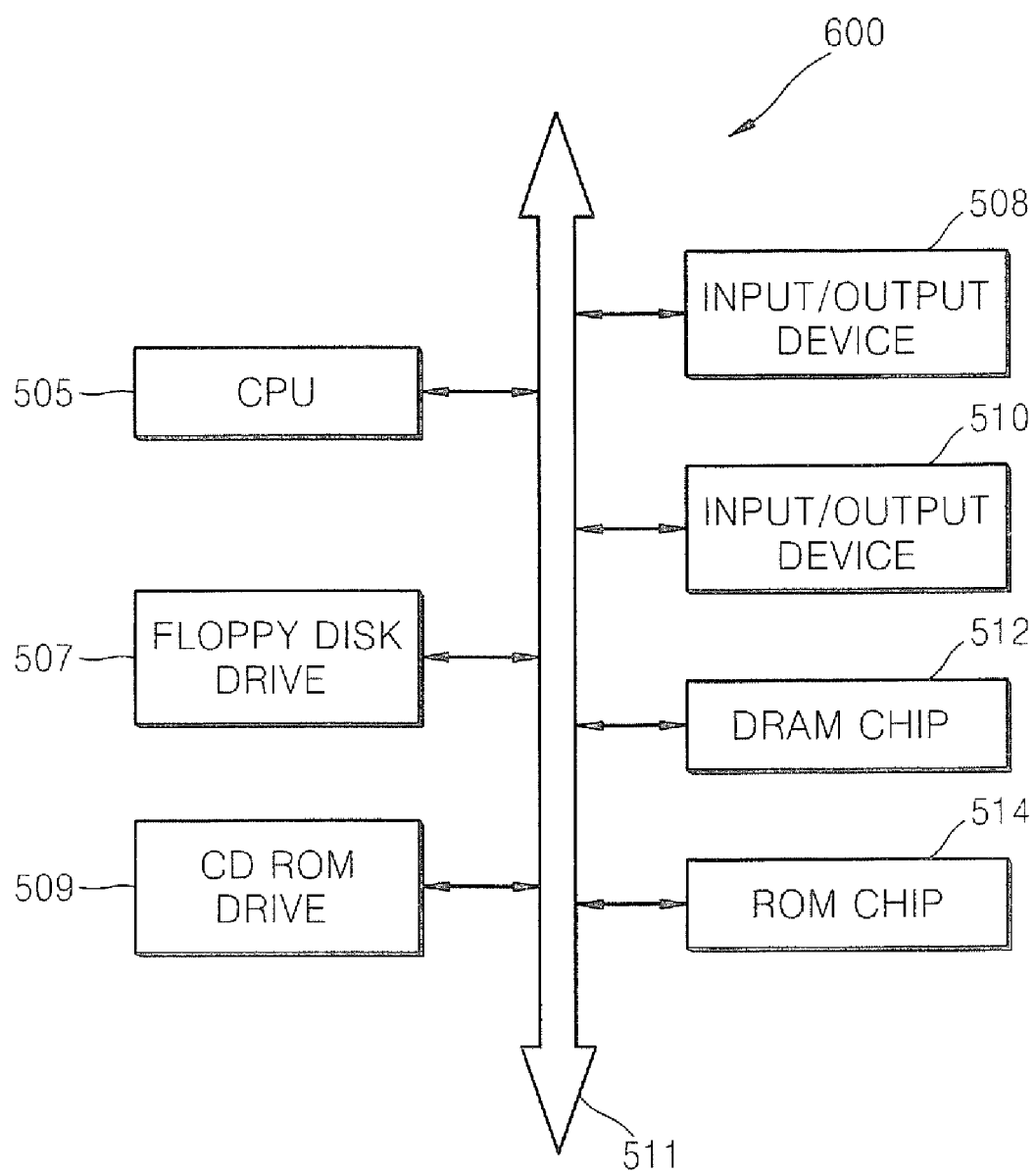
FIG. 19 is a block diagram of an electronic system including a DRAM chip according to the inventive concept.

FIG. 19 is a block diagram of an electronic system 600 including a DRAM chip according to the inventive concept.

In detail, the electronic system 600 is a computer. The electronic system 600 includes a central process unit (CPU) 505, peripheral devices such as a floppy disk drive 507 and a CD ROM drive 509, input/output devices 508 and 510, a DRAM chip 512, a ROM chip 514, etc. Control signals or data are transmitted between the components of the electronic system 600 using a communication channel 511. The DRAM chip 512 may also be replaced with the above-described memory module 500 including the DRAM chips 50-58.

Since a complicated capacitor formation process can be omitted when manufacturing the capacitor-less DRAM device according to the inventive concept, the integration degree of the DRAM device can be increased.

The capacitor-less DRAM device has a structure in which source and drain regions do not overlap with a gate electrode, and thus a leakage current due to a short channel effect and a leakage current in an off state such as a GIDL current can be reduced.

Also, a channel region of the capacitor-less DRAM device is defined so as to be self-aligned according to an offset spacer formed in the trench, and thus the operation of the DRAM device can be easily controlled through the gate electrode.

Also, the surface area of the body region between the source region and the drain region is increased in the capacitor-less DRAM device according to the inventive concept, and thus the storage surface area of holes is also increased. Accordingly, the capacitor-less DRAM device according to the inventive concept can be operated reliably.

While the inventive concept has been particularly shown and described with reference to exemplary embodiments thereof, it will be understood that various changes in form and details may be made therein without departing from the spirit and scope of the following claims.

What is claimed is:

1. A one-transistor (1T) memory cell, comprising:
a semiconductor layer on a substrate;
a buried insulating layer underlying said semiconductor layer;
a trench in said semiconductor layer;
an electrically insulating offset spacer on a sidewall of said trench;
a gate electrode in said trench;
a gate insulating layer extending between said gate electrode and a bottom of said trench, said gate insulating layer having a thickness less than a thickness of said offset spacer; and
source and drain regions in said semiconductor layer, on opposite sides of said trench;
wherein a distance between a bottom of said trench and said buried insulating layer is less than about one-third a length of said gate electrode at the bottom of said trench;
wherein a length of said gate electrode at a bottom of said trench is less than or equal to a minimum distance between the offset spacer on a source side of said trench and the offset spacer on a drain side of said trench;
wherein said gate insulating layer has a higher dielectric constant relative to the offset spacer; and
wherein a portion of the semiconductor layer extending between said gate insulating layer and said buried insulating layer is held in an electrically floating state that supports storage of data in the memory cell.

2. The memory cell of claim 1, wherein said gate insulating layer has a U-shaped cross-section that extends along a bottom and lower sidewall of said trench.

3. A capacitor-less DRAM device comprising:
an insulating layer formed on a semiconductor substrate;
a silicon layer formed on the insulating layer, wherein a trench is formed in the silicon layer;
an offset spacer formed on both sidewalls of the trench and protruding upward through the silicon layer;
a gate insulating layer formed on a bottom of the trench, said gate insulating layer having a thickness less than a thickness of the offset spacer;
a gate electrode formed on the gate insulating layer and buried in the trench and the offset spacer; and
a source region and a drain region formed in the silicon layer on both sides of the offset spacer so as not to overlap with the gate electrode;
wherein a channel region is formed to be self-aligned with the gate electrode in the silicon layer below the gate insulating layer;
wherein a thickness of the silicon layer below the gate insulating layer is smaller than a third of a length of a lower portion of the gate electrode;
wherein a length of the gate electrode at a bottom of the trench is less than or equal to a minimum distance between the offset spacer on a source side of the trench and the offset spacer on a drain side of the trench;
wherein said gate insulating layer has a higher dielectric constant relative to the offset spacer; and
wherein a portion of the silicon layer extending between said gate insulating layer and the insulating layer is held in an electrically floating state that supports storage of data in the DRAM device.

4. The capacitor-less DRAM device of claim 3, wherein the offset spacer is formed of a silicon oxide layer so that no inversion layer is formed on sidewalls of the trench which is adjacent to the offset spacer during the operation of the DRAM device.

5. The capacitor-less DRAM device of claim 3, further comprising a gate spacer on the source region and the drain region on both sidewalls of the offset spacer.

6. The capacitor-less DRAM device of claim 3, wherein a local channel impurity region is formed in the silicon layer below the gate insulating layer.

* * * * *